(12) United States Patent
Yeh

(10) Patent No.: US 7,265,581 B2
(45) Date of Patent: Sep. 4, 2007

(54) LEVEL SHIFTER

(75) Inventor: Shin-Hung Yeh, Taipei (TW)

(73) Assignee: Au Optronics Corp., Hsin-Chu (TW)

( * ) Notice: Subject to any disclaimer, the term of this patent is extended or adjusted under 35 U.S.C. 154(b) by 166 days.

(21) Appl. No.: 11/128,316

(22) Filed: May 13, 2005

(65) Prior Publication Data

US 2006/0164122 A1    Jul. 27, 2006

(30) Foreign Application Priority Data

Jan. 21, 2005    (TW)   .............................. 94101920 A

(51) Int. Cl.
*H03K 19/094*    (2006.01)
*H03K 19/0175*   (2006.01)
*H03L 5/00*      (2006.01)

(52) U.S. Cl. ............................ 326/63; 326/68; 326/80; 326/81; 327/333

(58) Field of Classification Search .................. 326/63, 326/80, 81
See application file for complete search history.

(56) References Cited

U.S. PATENT DOCUMENTS

| | | | | |
|---|---|---|---|---|
| 4,868,415 A | * | 9/1989 | Dunn | 327/122 |
| 5,559,464 A | * | 9/1996 | Orii et al. | 327/333 |
| 5,723,986 A | * | 3/1998 | Nakashiro et al. | 326/81 |
| 6,060,904 A | * | 5/2000 | Shimoda | 326/68 |
| 6,300,796 B1 | * | 10/2001 | Troutman et al. | 326/81 |
| 6,370,071 B1 | * | 4/2002 | Lall et al. | 365/205 |
| 6,407,579 B1 | * | 6/2002 | Goswick | 326/81 |
| 6,563,362 B2 | * | 5/2003 | Lambert | 327/333 |
| 6,566,909 B2 | * | 5/2003 | Okumura | 326/68 |
| 6,646,468 B2 | * | 11/2003 | Aitouarab | 326/81 |
| 6,700,407 B1 | * | 3/2004 | Wert | 326/81 |
| 6,734,704 B1 | * | 5/2004 | Burkland | 326/63 |
| 6,940,332 B2 | * | 9/2005 | Yamahira et al. | 327/333 |
| 7,034,585 B1 | * | 4/2006 | Kiani | 327/143 |
| 2005/0007026 A1 | * | 1/2005 | Lo et al. | 315/169.3 |
| 2005/0036581 A1 | * | 2/2005 | Lin | 377/54 |
| 2005/0052372 A1 | * | 3/2005 | Lee et al. | 345/82 |
| 2005/0099068 A1 | * | 5/2005 | Kimura | 307/112 |

FOREIGN PATENT DOCUMENTS

TW    091125179    10/1991

OTHER PUBLICATIONS

"A New low Power PMOS Poly-Si Inverter and Driving Circuits for Active Matrix Displays" by Sang-Hoon Jung et al. School of Electrical Engineering, Seoul National University, Seoul, Korea. SID 2003 DIGEST P1396-P1399.

* cited by examiner

*Primary Examiner*—Rexford Barnie
*Assistant Examiner*—Thienvu Tran
(74) *Attorney, Agent, or Firm*—Rabin & Berdo, P.C.

(57) ABSTRACT

The level shifter comprises a coupling block, a PMOS switch, a first PMOS transistor and a second PMOS transistor. The coupling block receives a first signal and a second signal to generate a first control signal and a first reference voltage. The first signal and the second signal are of opposite phases. The PMOS switch is controlled by the first control signal to choose the first reference voltage or a second reference voltage to be a second control signal. The first PMOS transistor is controlled by the first control signal. The second PMOS transistor is controlled by the second control signal. The connection point between the second PMOS transistor and the first PMOS transistor outputs an output signal.

19 Claims, 7 Drawing Sheets

US 7,265,581 B2

LEVEL SHIFTER

This application claims the benefit of Taiwan application Ser. No. 94101920, filed Jan. 21, 2005, the subject matter of which is incorporated herein by reference.

BACKGROUND OF THE INVENTION

1. Field of the Invention

The invention relates in general to a level shifter, and more particularly to a level shifter manufactured according to Low Temperature Poly-Silicon technology.

2. Description of the Related Art

The Low Temperature Poly-Silicon (LTPS) manufacturing technology of display is featured by integrating peripheral circuits and manufacturing directly on the glass substrate, so that signal transmission is sped up and a higher resolution is achieved. However, the LTPS technology is more complicated than amorphous silicon (a-Si) manufacturing process, hence resulting in a decrease in production efficiency and an increase in manufacturing costs. The key element of LTPS is more in terms of Complementary Metal-Oxide Semiconductor (CMOS). If the CMOS transistor is replaced by a P channel Metal-Oxide Semiconductor (PMOS) transistor, the number of masks used can be reduced and the manufacturing process can be further simplified.

In order to integrate the circuits and reduce the costs, applying the circuits whose design incorporates PMOS transistors to the LTPS manufacturing technology has become a focus in today's design of display, and level shifter is one of the circuits used in the display. Referring to FIG. 1, a conventional level shifter is shown. An output signal Output is generated according to a voltage VDD (0 V), a VSB (−20 V), a VSS (−30 V), a VSA (−15 V), and an input signal Input. The oscillation of the input signal Input ranges from 0 to −10 V, while the oscillation of the output signal Output ranges from 0 to −20 V. For the oscillation of the output signal Output to range from 0 to −20 V, a voltage VSS of −30 V and a voltage VSA of −15 V are further added. However, adding an even negative voltage leads to additional power consumption, and is not as practical as expected.

Referring to FIG. 2, another conventional level shifter is shown. The level shifter includes several transistors T1, T2, T3, T4, T5, T6, T7, T8, T9 and T10, wherein each of the transistors T1 to T10 has a drain D, a source S, and a gate G. The level shifter of FIG. 2, which is divided into an input stage, a switch stage, and an output stage, generates voltages V1, V2, V3 and V4 to be applied onto the circuits of various stages according to voltages VSS and VDD, and the functions of input signals In1 and In2. When functioning, the transistors T7 and T8 form a current path from the voltage VDD to the voltage VSS, and generates a static current, hence resulting in lasting power consumption. The transistors T1 and T2 as well as the transistors T3 and T4 also have the same problems.

However, if the above level shifter is applied in a portable electronic product such as the display panel of a mobile phone, the disadvantage of power consumption will shorten battery duration, jeopardizing the competitive power of the electronic product.

SUMMARY OF THE INVENTION

It is therefore an object of the invention to provide a level shifter manufactured according to Low Temperature Poly-Silicon (LTPS) manufacturing method. The level shifter includes a coupling block, a PMOS switch, a first PMOS transistor, and a second PMOS transistor. The coupling block receives a first signal and a second signal to generate a first control signal and a first reference voltage. The first signal and the second signal are inverted. The PMOS switch is controlled by the first control signal to choose the first reference voltage or a second reference voltage to be a second control signal. The first PMOS transistor is controlled by the first control signal. The second PMOS transistor is controlled by the second control signal. The connection point between the second PMOS switch and the first PMOS switch outputs an output signal whose level is obtained by shifting the level of the first signal.

Other objects, features, and advantages of the invention will become apparent from the following detailed description of the preferred but non-limiting embodiments. The following description is made with reference to the accompanying drawings.

DETAILED DESCRIPTION OF THE INVENTION

Figure 1:
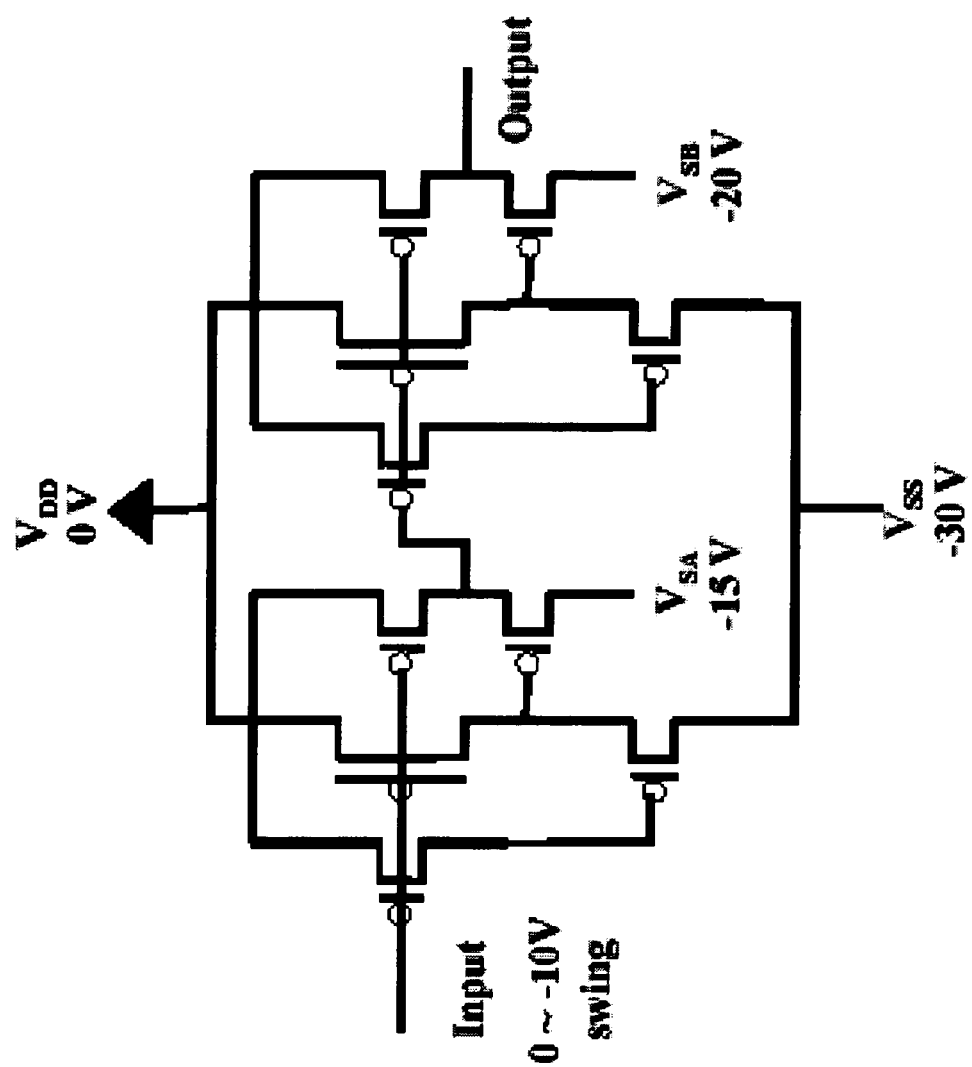
FIG. 1 is a conventional level shifter.
Figure 2:
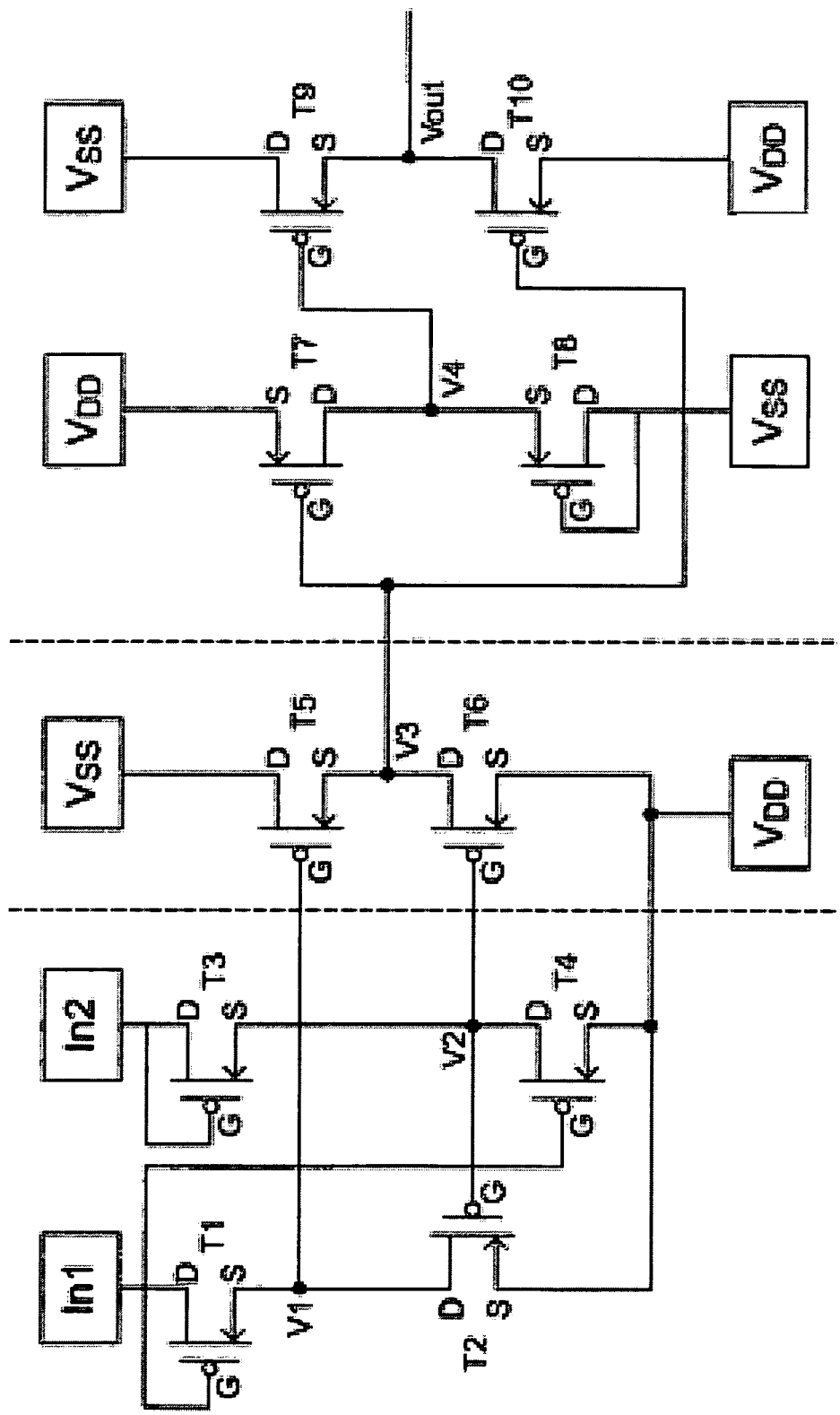
FIG. 2 is another conventional level shifter.
Figure 3:
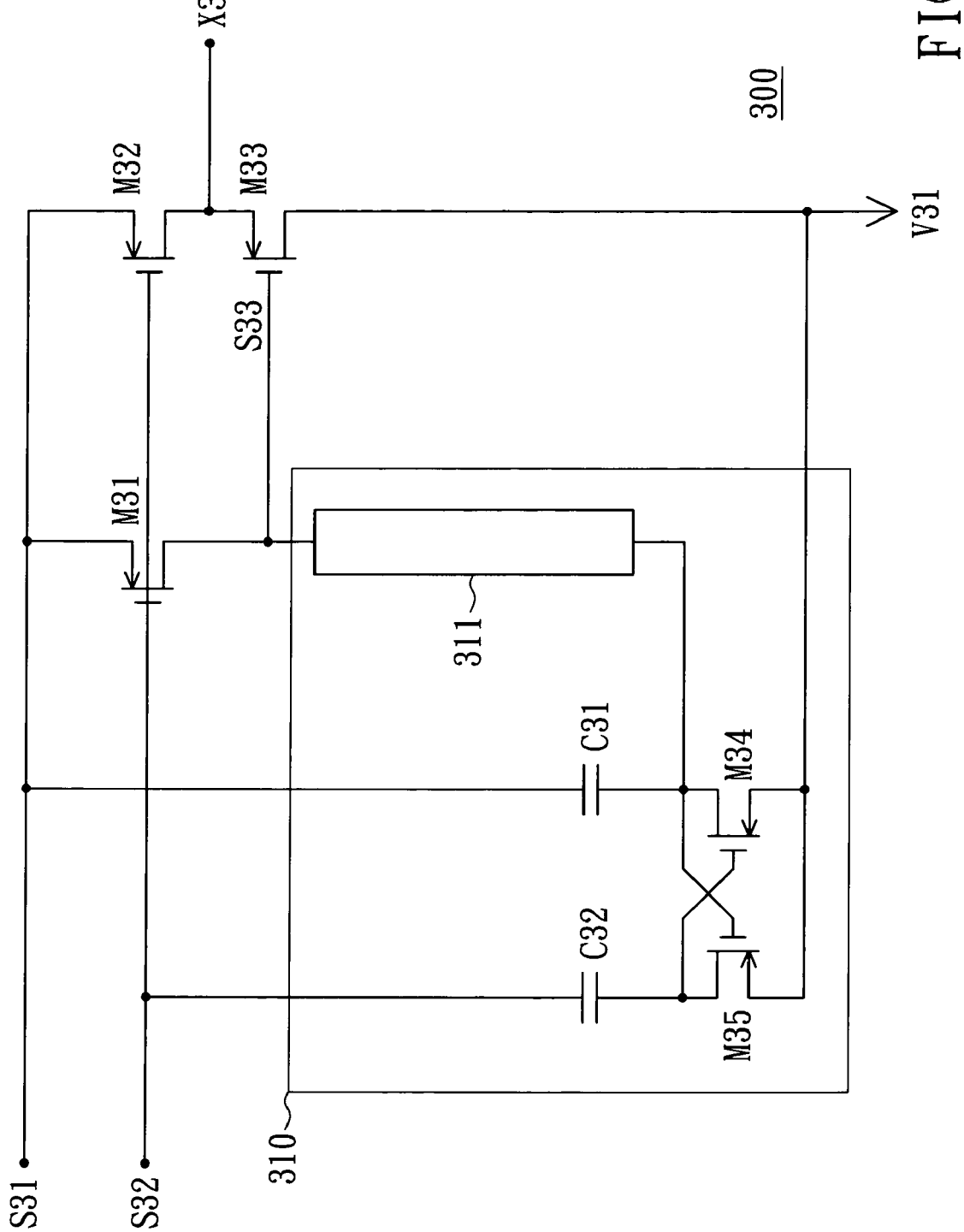
FIG. 3 is a circuit diagram of a level shifter according to a first embodiment of the invention.

Referring to FIG. 3, a circuit diagram of a level shifter according to a first embodiment of the invention is shown. The present embodiment provides a level shifter 300 manufactured according to Low Temperature Poly-Silicon (LTPS) manufacturing method. The level shifter 300 includes a PMOS switch M31, a PMOS transistor M32, a PMOS transistor M33 and a coupling block 310. The gate of the PMOS switch M31 receives a signal S32, while the drain of the PMOS switch M31 provides a first reference voltage. The PMOS switch M31 chooses the first reference voltage or a second reference voltage to be a signal S33, while the source of the PMOS switch M31 receives the signal S31 having the level of the first reference voltage. The gate of the PMOS transistor M32 receives the signal S32, while the source of the PMOS switch M32 receives the signal S31. The gate of the PMOS transistor M33 is coupled to the drain of the PMOS switch M31 and receives the signal S33, the drain of the PMOS transistor M33 is coupled to a low voltage V31, while the source of the PMOS transistor M33 is coupled to the drain of the PMOS transistor M32 and generates an output signal X3. The coupling block 310 is for receiving the signals S31 and S32 to output the second reference voltage.

The coupling block 310 includes a PMOS transistor M34, a PMOS transistor M35, a capacitor C31, a capacitor C32 and a one-way conducting device 311. The source of the PMOS transistor M34 is coupled to a low voltage V31. The gate of the PMOS transistor M35 is coupled to the drain of the PMOS transistor M34, the drain of the PMOS transistor M35 is coupled to the gate of the PMOS transistor M34, while the source of the PMOS transistor M35 is coupled to the low voltage V31. One end of the capacitor C31 receives the signal S31, while another end of the capacitor C31 is coupled to the drain of the PMOS transistor M34. One end of the capacitor C32 receives the signal S32, while another end of the capacitor C32 is coupled to the drain of the PMOS transistor M35. The input end of the one-way conducting device 311 is coupled to the drain of the PMOS transistor M34, while the output end of the one-way conducting device 311 is coupled to the drain of the PMOS transistor M31 and generates the second reference voltage.

Figure 5:
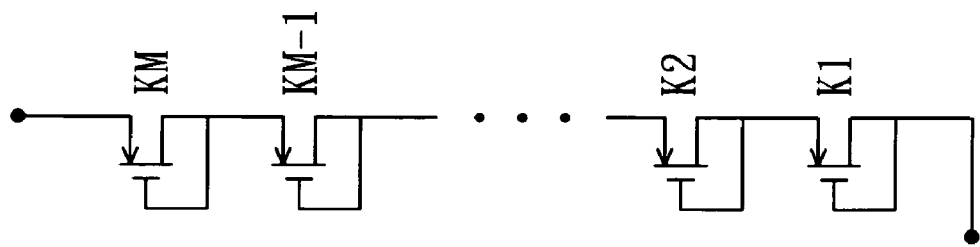
FIG. 5 is another example of a circuit diagram of the one-way conducting device.
Figure 4:
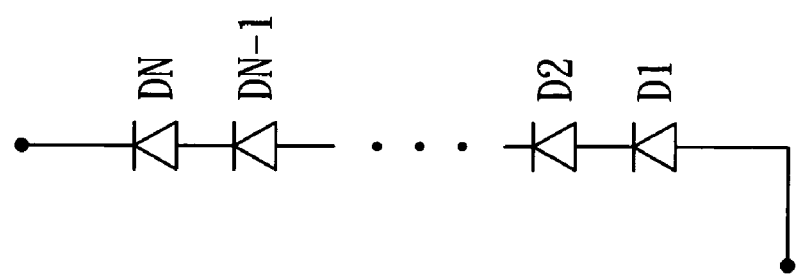
FIG. 4 is an example of a circuit diagram of the one-way conducting device.

The one-way conducting device 311 can be achieved as below. Referring to FIG. 4, an example of a circuit diagram of the one-way conducting device is shown. The one-way conducting device 311 includes N serially connected diodes D1 to DN. The positive end of each diode D is coupled to the negative end of previous diode D, the positive end of the diode D1 is the input end of the one-way conducting device 311, and the negative end of the diode DN is the output end of the one-way conducting device 311. Referring to FIG. 5, another example of a circuit diagram of the one-way conducting device is shown. The one-way conducting device 311 includes M serially connected PMOS transistors K1 to KM. The drain of each PMOS transistor K is coupled to the gate of the PMOS transistor K as well as the source of the previous PMOS transistor K. The drain of the PMOS transistor K1 is the input end of the one-way conducting device 311. The source of the PMOS transistor KM is the output end of the one-way conducting device 311. However, the number of diodes or PMOS transistors disposed in the one-way conducting device 311 does not necessarily to be in plural form. Any number of diodes or PMOS transistors that provides a reference voltage and one-way conductivity will do.

Figure 6:
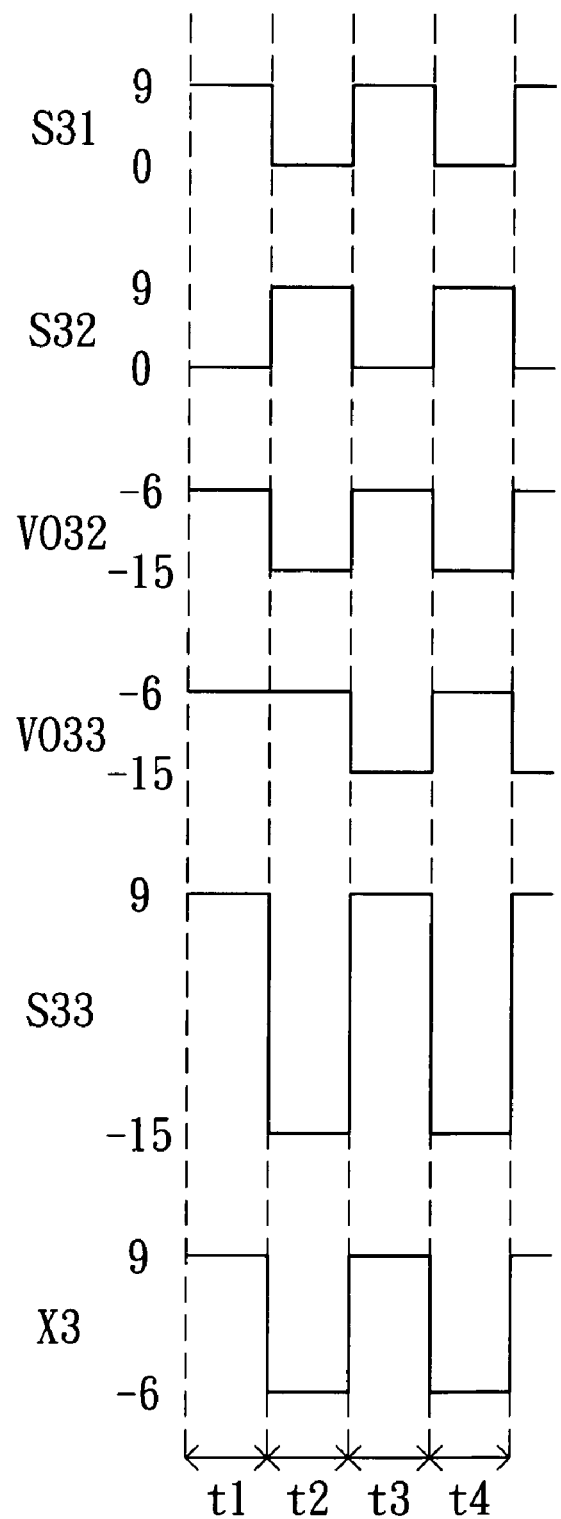
FIG. 6 is a signal time sequence diagram of a level shifter according to a first embodiment of the invention.

In the present embodiment, the signal S31, a clock signal of 9 to 0 V, and the signal S32, a clock signal of 9 to 0 V, are inverted. The low voltage V31 is −6 V. Referring to both FIG. 3 and FIG. 6 at the same time, FIG. 6 is a signal time sequence diagram of a level shifter according to a first embodiment of the invention. Voltage VO32 is the voltage at the drain of the PMOS transistor M34, and voltage VO33 is the voltage at the drain of the PMOS transistor M35. The operations of the circuit inside the coupling block 310 are elaborated below. During time period t1, the signal S31 is 9 V, while the signal S32 is 0 V. Meanwhile, the voltage VO32 and voltage VO33 are at initial state and are hard to define, hence are assumed to be close to the low voltage V31 which is −6 V.

During time period t2, the signal S31 is 0 V, and the signal S32 is 9 V. Due to the coupling effect of the capacitor C31, the voltage drop is fixed. During time period t1, the voltage drop is equal to the difference between 9 V and −6 V which is 15 V due to the voltage VO32 and the signal S31. During time period t2, the signal S31 is reduced to 0 V and the voltage VO32 is reduced to −15 V, so that the PMOS transistor M35 is conducted and that the voltage VO33 is equal to −6 V. During time period t3, the signal S31 is 9 V, while the signal S32 is 0 V. The voltage VO33 is reduced to −15 V due to the coupling effect of the capacitor C32, so that the PMOS transistor M34 is conducted and that the voltage VO32 is −6 V. During time period t4', the voltage VO32 is −15 V. Hence, the voltage VO32 and the signal S31 are in phase. When the signal S31 is 9 V, the voltage VO32 is −6 V; when the signal S31 is 0 V, the voltage VO32 is −15 V.

The operations of the signal of the level shifter 300 are elaborated below. During time period t1, the signal S31 is 9 V, while the signal S32 is 0 V. The PMOS switches M31 and M32 are conducted, so that the signal S33 and the output signal X3 are 9 V, and that the PMOS transistor M33 is not conducted. Since the PMOS transistor M33 is not conducted, no current flows to the low voltage V31 from the signal S31 and the power consumption is thus reduced. During time period t2, the PMOS switches M31 and M32 are not conducted. Since the voltage VO32 is −15 V, the level of the voltage VO32 outputted by the one-way conducting device 311 is equal to the previously defined second reference voltage, so that the signal S33 is −15 V, the PMOS transistor M33 is conducted, and that the output signal X3 is −6 V. After time period t2, the oscillation of the signal S33 ranges from −15 to 9 V. Hence, the oscillation of the output signal X3 ranges from 9 V to −6 V and varies with the signals S31 and S32.

Figure 7:
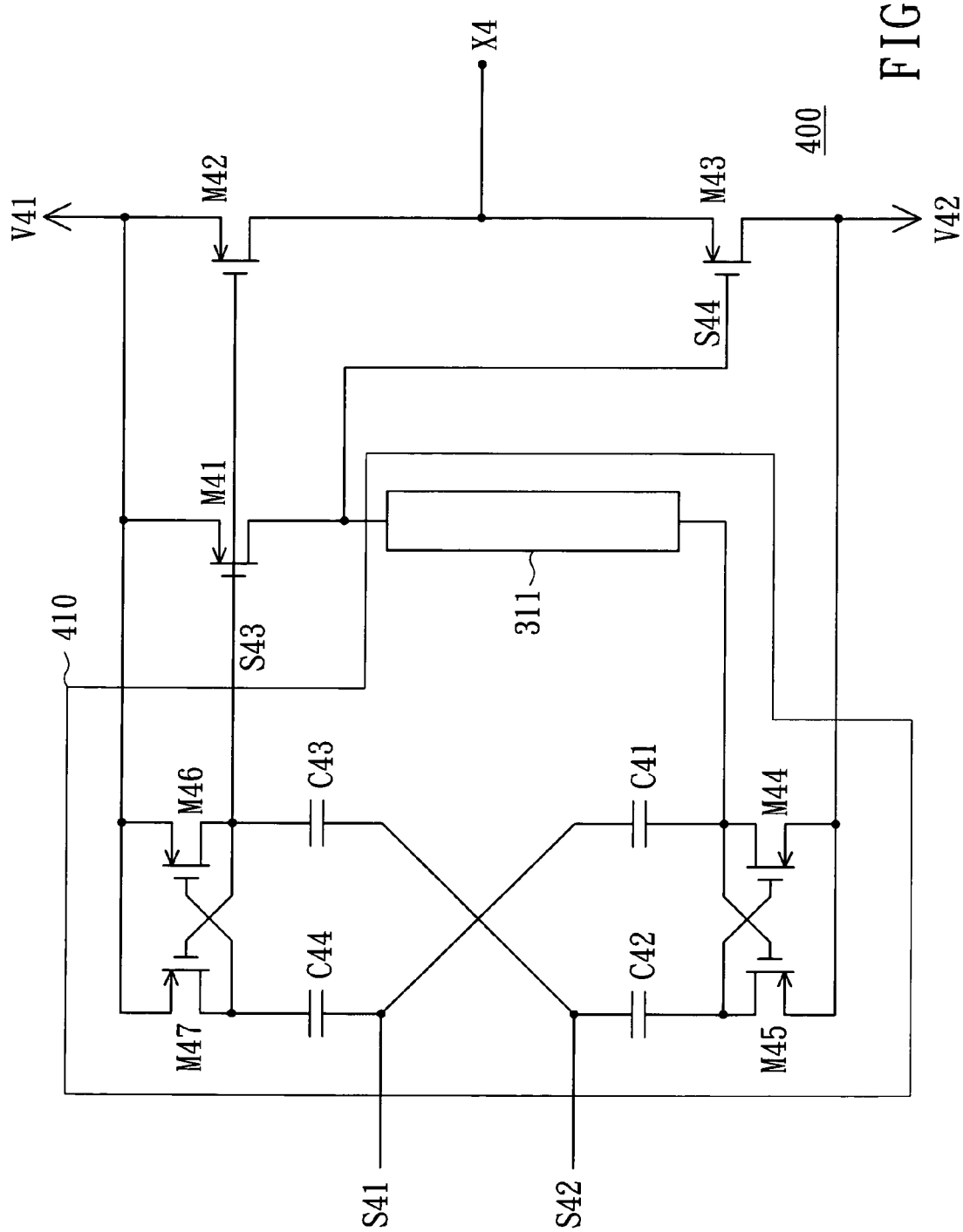
FIG. 7 is a circuit diagram of a level shifter according to a second embodiment of the invention.

Referring to FIG. 7, a circuit diagram of a level shifter according to a second embodiment of the invention is shown. The present embodiment provides a level shifter 400 manufactured according to Low Temperature Poly-Silicon (LTPS) manufacturing method. The level shifter 400 includes a PMOS switch M41, a PMOS transistor M42, a PMOS transistor M43 and a coupling block 410. The gate of the PMOS switch M41 receives a signal S43, the drain of the PMOS switch M41 provides a third reference voltage, while the source of the PMOS switch M41 is biased to a high voltage V41. The PMOS switch M41 chooses the third reference voltage or a fourth reference voltage to be a signal S44. The gate of the PMOS transistor M42 receives the signal S43, the source of the PMOS transistor M42 is biased to the high voltage V41. The gate of the PMOS transistor M43 receives the signal S44, the drain of the PMOS transistor M43 is coupled to low voltage V42, the source of the PMOS transistor M43 is coupled to the drain of the PMOS transistor M42 and generates a signal X4. The coupling block 410 is for receiving signals S41 and S42 to generate the signal S43 and provide the fourth reference voltage.

The coupling block 410 includes several PMOS transistors M44, M45, M46, and M47, several capacitors C41, C42, C43, and C44 and the one-way conducting device 311. The source of the transistor M44 is coupled to a low voltage V42. The gate of the PMOS transistor M45 is coupled to the drain of the PMOS transistor M44, the drain of the PMOS transistor M45 is coupled to the gate of the PMOS transistor M44, while the source of the PMOS transistor M45 is coupled to the low voltage V42. One end of the capacitor C41 receives a signal S41, while another end of the capacitor C41 is coupled to the drain of the PMOS transistor M44. One end of the capacitor C42 receives the signal S42, while another end of the capacitor C42 is coupled to the drain of the PMOS transistor M45.

The source of the PMOS transistor M46 is biased to the high voltage V41. The gate of the PMOS transistor M47 is coupled to the drain of PMOS transistor M46, the drain of the PMOS transistor M47 is coupled to the gate of the PMOS transistor M46, while the source of the PMOS transistor M47 is biased to the high voltage V41. One end point of the capacitor C43 receives the signal S42, while another end point O43 is coupled to the drain of the PMOS transistor M46 to generate the signal S43. One end point of the capacitor C44 receives the signal S41, while another end point O44 of the capacitor C44 is coupled to the drain of the PMOS transistor M47. The output end of the one-way conducting device 311 is coupled to the drain of the PMOS switch M41 and provides the fourth reference voltage, while the input end of the one-way conducting device 311 is coupled to the drain of the PMOS transistor M44. The contents of the one-way conducting device 311 are disclosed in the first embodiment and are not repeated here.

Figure 8:
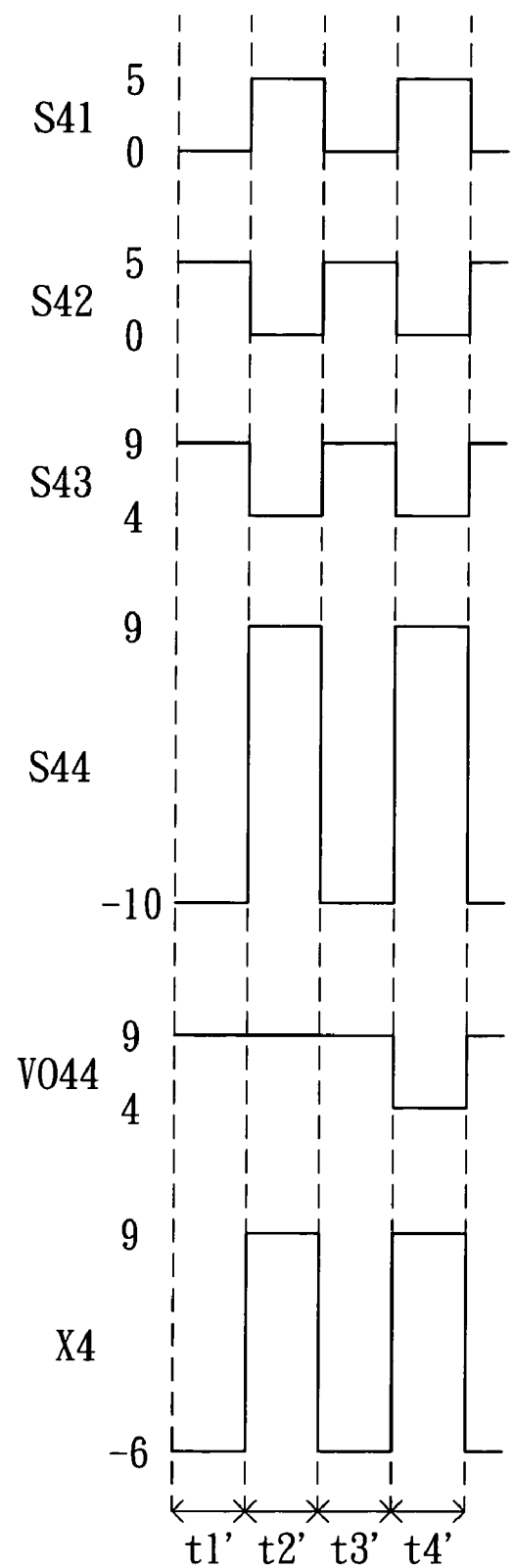
FIG. 8 is a signal time sequence diagram of a level shifter according to a second embodiment of the invention.

Referring to both FIG. 7 and FIG. 8 at the same time. FIG. 8 is a signal time sequence diagram of a level shifter according to a second embodiment of the invention. The signals S41, a clock signal ranging between 5 and 0 V, and the signal S42, a clock signal ranging between from 5 and 0 V, are inverted. The high voltage V41 is 9 V, while the low voltage V42 is −6 V. The voltage VO44 is the voltage at the drain of the PMOS transistor M47.

The generation of the signal S43 is elaborated below. During time period t1', the signal S41 is 0 V, while the signal S42 is 5 V. Meanwhile, the signal S43 of the end point O43 and the voltage VO44 of the end point O44, being at initial state, are assumed to be close to the value of the high voltage V41 which is 9 V. During time period t2', the signal S41 is 5 V, while the signal S42 is 0 V. During time period t1', the voltage drop is equal to the difference of 9 V and 5 V which is 4 V due to the signals S43 and S42 and the coupling effect of the capacitor C43. During time period t2', the signal S42 is reduced to 0 V, and the signal S43 is reduced to 4 V accordingly, so that the PMOS transistor M47 is conducted, and that the voltage VO44 is 9 V. During time period t3', the signal S41 is 0 V, and the signal S42 is 5 V. The voltage O44 of the end point O44, is reduced to 4 V due to the coupling effect of the capacitor C44, so that the PMOS transistor M46 is conducted, and that the signal S43 is 9 V. During time period t4', the signal S43 is 4 V. Hence the signal S43 which is a clock signal and the signal S42 are in phase. When the signal S42 is 5 V, the signal S43 is 9 V; when the signal S42 is 0 V, the signal S43 is 4 V.

The signal S44 is formed by the third reference voltage provided by the PMOS switch M41 and the fourth reference voltage provided by the one-way conducting device 311. According to the present embodiment, the third reference voltage is the high level voltage V41 when the PMOS switch M41 is conducted; the fourth reference voltage, which is provided by the one-way conducting device 311 when the PMOS switch M41 is not conducted, is −10 V. The structure and the operations of the circuit formed by the PMOS transistors M44, M45, the capacitors C41, C42 and the one-way conducting device 311 are the same with that of the coupling block 310 with the only difference being the level of the signal. Anyone who is skilled in the technology can obtain the fourth reference voltage of the circuit according to the previous embodiment and is not repeated here. The operations of the level shifter 400 are exemplified by the signal S44 as below.

The operations of the signal of the level shifter 400 are elaborated below. During time period t1', the signal S43 is 9 V while the signal S44 is −10 V, so that the PMOS switch M41 and the PMOS transistor M42 are not conductive, the PMOS transistor M43 is conductive, and that the output signal X4 is −6 V. During time period t2', the signal S43 is 4 V while the signal S44 is 9 V, so that the PMOS switch M41 and the PMOS transistor M42 are conductive, the PMOS transistor M43 is not conductive, and that the output signal X4 is 9 V. Hence, the output signal X4 whose oscillation ranges between 9 V and −6 V and the signal S41 are in phase.

According to the invention, the values of the signals S31, S32, S41, S42, the low voltage V31, the low voltage V42 and the high voltage V41 are not fixed, and any value will do as long as the above elements can be enabled to function as in the above embodiments. According to the design of the invention, whether the PMOS transistor is conducted or not does not generate static current, hence no power is wasted.

The level shifter disclosed in above embodiment of the invention can be achieved according to the LTPS manufacturing method with the advantages that fewer masks are needed and that circuits are integrated to reduce the costs. Moreover, the design of the circuit avoids the power consumption of the stable current or when providing a higher or a lower voltage in response to the oscillation of the output signal, therefore improving the applicability of the product.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A level shifter, comprising:
a coupling device, which is coupled to a first signal via a first input end and coupled to a second signal via a second input end, outputting a first control signal in response to the second signal via a first output end and outputting a first reference voltage selectively via a second output end, wherein the first signal and the second signal are inverted, the first control signal having a first voltage in a first period and a second voltage in a second period, the coupling device comprising:
a one-way conducting device, having a first end and a second end, the first end acting as the second output end to selectively output the first reference voltage, the voltage of the second end of the one-way conducting device being related to voltage of the second signal, the voltage of the second end of the one-way conducting device being a third voltage in the first period and being a fourth voltage in the second period;
a first-type control transistor comprising a first gate, a first source and a first drain, wherein the first gate is controlled by the first control signal, while the first drain is for outputting a second reference voltage when the first-type control transistor is conductive;
a first-type first transistor comprising a second gate, a second source and a second drain, wherein the second gate is controlled by the first control signal; and
a first-type second transistor comprising a third gate, a third source, and a third drain, wherein the third gate is electrically connected to the first drain and the first end of the one-way conducting device, the third gate is controlled by the first reference voltage or the second reference voltage, and the third source is coupled to the second drain and generates an output signal;
wherein in the first period, the first-type control transistor and the first-type first transistor are made conductive by the first voltage of the first control signal, the second reference voltage is generated so that the first-type second transistor is not conductive, the one-way conducting device is not conductive due to the second reference voltage and the third voltage of the second end of the one-way conducting device, and the voltage of the output signal is related to the voltage of the second source of the first-type first transistor;
wherein in the second period, the first-type control transistor and the first-type first transistor are not conductive due the second voltage of the first control signal, the one-way conducting device is conductive due to the fourth voltage of the second end of the one-way conducting device to generate the first reference voltage, the first-type second transistor is made conductive by the first reference voltage, and the voltage of the output signal is related to the voltage of the third drain of the first-type second transistor.

2. The level shifter according to claim 1, wherein the coupling device comprises:
   a first-type third transistor comprising a fourth gate, a fourth drain and a fourth source, wherein the fourth source is coupled to a first bias voltage;
   a first-type fourth transistor comprising a fifth gate coupled to the fourth drain, a fifth source coupled to the first bias voltage, and a fifth drain coupled to the fourth gate;
   a first capacitor for coupling the first signal to the fourth drain; and
   a second capacitor for coupling the second signal to the fifth drain,
   the one-way conducting device being coupled between the fourth drain and the first drain and for outputting the first reference voltage via the second output end.

3. A level shifter, comprising:
   a coupling device, which is coupled to a first signal via a first input end and coupled to a second signal via a second input end, outputting a first control signal via a first output end and outputting a first reference voltage via a second output end, wherein the first signal and the second signal are inverted, wherein the coupling device further comprises:
      a first-type fifth transistor comprising a sixth gate, a sixth drain and a sixth source, wherein the sixth source is coupled to a second bias voltage;
      a first-type sixth transistor comprising a seventh gate coupled to the sixth drain, a seventh source coupled to the second bias voltage, and a seventh drain coupled to the sixth gate, wherein the seventh drain generates the first control signal;
      a third capacitor for coupling the first signal to the sixth drain; and
      a fourth capacitor for coupling the second signal to the seventh drain;
   a first-type control transistor comprising a first gate, a first source and a first drain, wherein the first gate is controlled by the first control signal, while the first drain is for outputting a second reference voltage;
   a first-type first transistor comprising a second gate, a second source and a second drain, wherein the second gate is controlled by the first control signal; and
   a first-type second transistor comprising a third gate, a third source and a third drain, wherein the third gate is controlled by the first reference voltage or the second reference voltage, the third source is coupled to the second drain and generates an output signal;
   wherein the level of the output signal is obtained by shifting the level of the first signal.

4. The level shifter according to claim 2, wherein the one-way conducting device comprises N diodes connected in serial, N is a natural number and is larger than or equal to 1.

5. The level shifter according to claim 2, wherein the one-way conducting device comprises M transistors connected in serial, M is a natural number and is larger than or equal to 1.

6. The level shifter according to claim 1, wherein the first-type is P-type.

7. The level shifter according to claim 6, wherein the P-type transistor is a P-type Low Temperature Poly-Silicon (LTPS) transistor.

8. A level shifter, comprising:
   a first-type control transistor comprising a first gate, a first source and a first drain, wherein the first source is for receiving a first signal, the first gate is controlled by a second signal, while the first drain is for outputting a first reference voltage when the first-type control transistor is conductive, the first signal and the second signal are inverted, the second signal having a first voltage in a first period and a second voltage in a second period;
   a coupling device, which is coupled to the first signal via a first input end, coupled to the second signal via a second input end, and coupled to a bias voltage via a third input end, outputting a second reference voltage selectively via an output end, wherein the output end is coupled to the first drain, the coupling device comprising:
      a one-way conducting device, having a first end and a second end, the first end acting as the output end to selectively output the second reference voltage, the voltage of the second end of the one-way conducting device being related to the voltage of the second signal, the voltage of the second end of the one-way conducting device being a third voltage in the first period and being a fourth voltage in the second period;
   a first-type first transistor comprising a second gate, a second source and a second drain, wherein the second source is for receiving the first signal, while the second gate is controlled by the second signal; and
   a first-type second transistor comprising a third gate, a third source, and a third drain, wherein the third pate is electrically connected to the first drain and the first end of the one-way conducting device, the third gate is controlled by the first reference voltage or the second reference voltage, the third drain is coupled to the bias voltage, the third source is coupled to the second drain and generates an output signal;
   wherein in the first period, the first-type control transistor and the first-type first transistor are made conductive by the first voltage of the second signal, the first reference voltage is generated so that the first-type second transistor is not conductive, the one-way conducting device is not conductive due to the first reference voltage and the third voltage of the second end of the one-way conducting device, and the voltage of the output signal is related to the voltage of the second source of the first-type first transistor;
   wherein in the second period, the first-type control transistor and the first-type first transistor are not conductive due by the second voltage of the second signal, the one-way conducting device is conductive due to the fourth voltage of the second end of the one-way conducting device to generate the second reference voltage, the first-type second transistor is made conductive by the second reference voltage, and the voltage of the output signal is related to the voltage of the third drain of the first-type second transistor.

9. The level shifter according to claim 8, wherein the coupling device further comprises:

a first-type third transistor comprising a fourth gate, a fourth drain, and a fourth source coupled to the bias voltage;

a first-type fourth transistor comprising a fifth gate coupled to the fourth drain, a fifth source coupled to the bias voltage, and a fifth drain coupled to the fourth gate;

a first capacitor for coupling the first signal to the fourth drain; and a second capacitor for coupling the second signal to the fifth drain, the one-way conducting device being coupling between the fourth drain and the first drain and for outputting the second reference voltage via the output end.

10. The level shifter according to claim 9, wherein the one-way conducting device comprises N diodes connected in serial, N is a natural number and is larger than or equal to 1.

11. The level shifter according to claim 9, wherein the one-way conducting device comprises M transistors connected in serial, M is a natural number and is larger than or equal to 1.

12. The level shifter according to claim 8, wherein the first-type is P-type.

13. The level shifter according to claim 12, wherein the P-type transistor is a P-type Low Temperature Poly-Silicon transistor.

14. A level shifter, comprising:

a coupling device, which is coupled to a first signal via a first input end, coupled to a second signal via a second input end, coupled to a first bias voltage via a third input end, and coupled to a second bias voltage via a fourth input end, outputting a first control signal in response to the second signal via a first output end and outputting a first reference voltage selectively via a second output end, wherein the first signal and the second signal are inverted, the first control signal having a first voltage in a first period and a second voltage in a second period, the coupling device comprising:

a one-way conducting device, having a first end and a second end, the first end acting as the second output end to selectively output the first reference voltage, the voltage of the second end of the one-way conducting device being related to the voltage of the second signal, the voltage of the second end of the one-way conducting device being a third voltage in the first period and being a fourth voltage in the second period;

a first-type control transistor comprising a first gate, a first source, and a first drain, wherein the first source is coupled to the first bias voltage, the first gate is controlled by the first control signal, while the first drain is for outputting a second reference voltage when the first-type control transistor is conductive;

a first-type first transistor comprising a second gate, a second source, and a second drain, wherein the second source is coupled to the first bias voltage, while the second gate is controlled by the first control signal; and a first-type second transistor comprising a third gate, a third source, and a third drain, wherein the third gate is electrically connected to the first drain and the first end of the one-way conducting device, the third gate is controlled by the first reference voltage or the second reference voltage, the third drain is coupled to the second bias voltage, while the third source is coupled to the second drain and generates an output signal;

wherein in the first period, the first-type control transistor and the first-type first transistor are made conductive by the first voltage of the first control signal, the second reference voltage is generated so that the first-type second transistor is not conductive, the one-way conducting device is not conductive due to the second reference voltage and the third voltage of the second end of the one-way conducting device, and the voltage of the output signal is related to the first bias voltage;

wherein in the second period, the first-type control transistor and the first-type first transistor are not conductive due the second voltage of the first control signal, the one-way conducting device is conductive due to the fourth voltage of the second end of the one-way conducting device to generate the first reference voltage, the first-type second transistor is made conductive by the first reference voltage, and the voltage of the output signal is related to the voltage of the second bias voltage.

15. A level shifter, comprising:

a coupling device, which is coupled to a first signal via a first input end, coupled to a second signal via a second input end, coupled to a first bias voltage via a third input end, and coupled to a second bias voltage via a fourth input end, outputting a first control signal via a first output end and outputting a first reference voltage via a second output end, wherein the first signal and the second signal are inverted, wherein the coupling device further comprises:

a first-type third transistor comprising a fourth gate, a fourth drain, and a fourth source coupled to the second bias voltage;

a first-type fourth transistor comprising a fifth gate coupled to the fourth drain, a fifth source coupled to the second bias voltage, and a fifth drain coupled to the fourth gate;

a first capacitor for coupling the first signal to the fourth drain;

a second capacitor for coupling the second signal to the fifth drain;

a one-way conducting device coupled between the fourth drain and the first drain and for outputting the first reference voltage via the second output end;

a first-type fifth transistor comprising a sixth gate, a sixth drain, and a sixth source, wherein the sixth source is coupled to a first bias voltage;

a first-type sixth transistor comprising a seventh gate coupled to the sixth drain, a seventh source coupled to the first bias voltage, and a seventh drain coupled to the sixth gate, wherein the seventh drain generates the first control signal;

a third capacitor for coupling the first signal to the sixth drain; and a fourth capacitor for coupling the second signal to the seventh drain;

a first-type control transistor comprising a first gate, a first source, and a first drain, wherein the first source is coupled to the first bias voltage, the first gate is controlled by the first control signal, while the first drain is for outputting a second reference voltage;

a first-type first transistor comprising a second gate, a second source, and a second drain, wherein the second source is coupled to the first bias voltage, while the second gate is controlled by the first control signal; and a first-type second transistor comprising a third pate, a third source, and a third drain, wherein the third gate is controlled by the first reference voltage or the second reference voltage, the third drain is coupled to the second bias voltage, while the third source is coupled to the second drain and generates an output signal;

wherein the level of the output signal is obtained by shifting the level of the first signal.

16. The level shifter according to claim 15, wherein the one-way conducting device comprises N diodes connected in serial, N is a natural number and is larger than or equal to 1.

17. The level shifter according to claim 15, wherein the one-way conducting device comprises M transistors connected in serial, M is a natural number and is larger than or equal to 1.

18. The level shifter according to claim 14, wherein the first-type is P-type.

19. The level shifter according to claim 18, wherein the P-type transistor is a P-type Low Temperature Poly-Silicon transistor.

* * * * *